(12) United States Patent
Dogiamis et al.

(10) Patent No.: US 11,316,497 B2
(45) Date of Patent: Apr. 26, 2022

(54) MULTI-FILTER DIE

(71) Applicant: Intel Corporation, Santa Clara, CA (US)

(72) Inventors: Georgios Dogiamis, Chandler, AZ (US); Aleksandar Aleksov, Chandler, AZ (US); Feras Eid, Chandler, AZ (US); Telesphor Kamgaing, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 16/707,497

(22) Filed: Dec. 9, 2019

(65) Prior Publication Data

US 2021/0175873 A1    Jun. 10, 2021

(51) Int. Cl.
*H03H 9/54* (2006.01)
*H03H 9/02* (2006.01)
*H03H 9/64* (2006.01)

(52) U.S. Cl.
CPC .......... *H03H 9/54* (2013.01); *H03H 9/02574* (2013.01); *H03H 9/02913* (2013.01); *H03H 9/6483* (2013.01)

(58) Field of Classification Search
CPC .. H03H 9/54; H03H 9/02574; H03H 9/02913; H03H 9/6483
See application file for complete search history.

(56) References Cited

U.S. PATENT DOCUMENTS

| | | | |
|---|---|---|---|
| 2002/0089395 A1* | 7/2002 | Ella | H03H 9/589 333/189 |
| 2009/0058555 A1* | 3/2009 | Takata | H03H 9/725 333/129 |
| 2018/0019727 A1* | 1/2018 | Ando | H03H 9/6483 |
| 2018/0183406 A1* | 6/2018 | Patil | H03H 9/1014 |
| 2018/0247904 A1* | 8/2018 | Hsieh | H01L 23/645 |
| 2020/0014365 A1* | 1/2020 | Nambu | H03H 9/1092 |

\* cited by examiner

*Primary Examiner* — Samuel S Outten
(74) *Attorney, Agent, or Firm* — Patent Captal Group

(57) ABSTRACT

Embodiments may relate to a die such as an acoustic wave resonator (AWR) die. The die may include a first filter and a second filter in the die body. The die may further include an electromagnetic interference (EMI) structure that surrounds at least one of the filters. Other embodiments may be described or claimed.

20 Claims, 10 Drawing Sheets

US 11,316,497 B2

MULTI-FILTER DIE

BACKGROUND

Legacy radio frequency (RF) front-end (FE) solutions may utilize several discrete acoustic wave resonator (AWR) dies, each implementing a specific filter, for different bandwidths (e.g., bandwidths related to long-term evolution (LTE) or some other communication protocol). The AWR dies, along with power amplifier (PA) dies, switch dies, control electronics, surface mount technology (SMT) devices, etc., may constitute an RF system-in-package (SiP).

DETAILED DESCRIPTION

Figure 1:
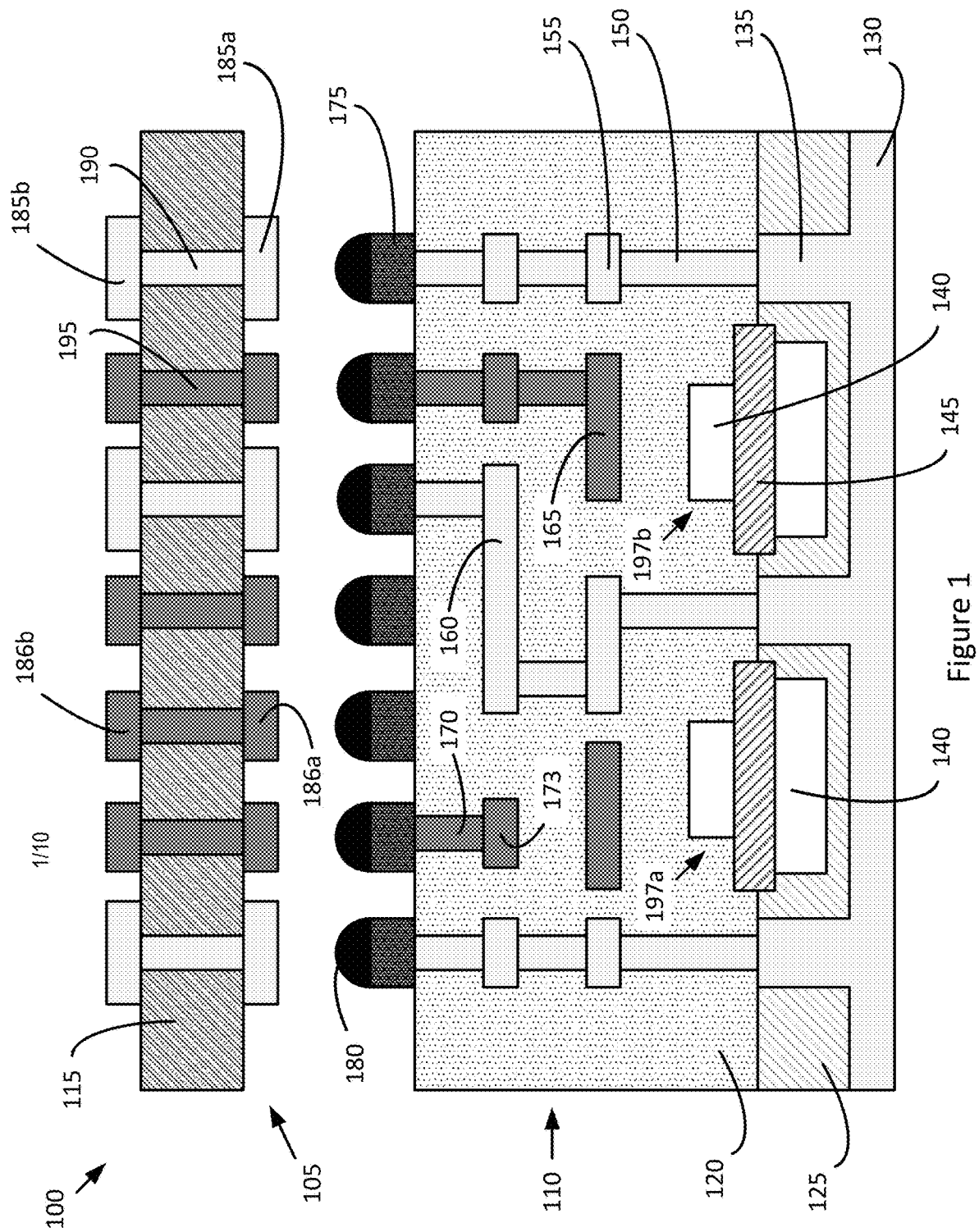
FIG. 1 depicts a simplified cross-sectional view of an example multi-filter AWR die, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted, legacy RF FE solutions may use several discrete AWR dies, each implementing a specific filter, for different communication bands. The AWR dies, along with PA dies, switch dies, control electronics, SMT devices, etc. may constitute what is referred to as an RF SiP. The AWR dies may be supported by inductors which are implemented within layers of the package substrate of the SiP (e.g., implemented in up to or more than 4 layers of the package substrate). Typically, the inductors may be implemented in the die shadow of the AWR dies. As used herein, the "die shadow" may refer to a portion of the package substrate that is adjacent to the AWR dies. EMI shielding may be applied between inductors that are related to different frequency bands. Typically, the EMI shielding may be applied by the use of in-package ground vias (e.g., vias that are coupled with Vss). If further shielding is needed, wire-bonds that loop over the AWR dies may be used. In some legacy solutions, partitioning of the system may be employed, where AWR dies of the same band category (e.g., high, mid, or low-band) may be spaced relatively closely together, while a larger distance is maintained between AWR dies of different band categories.

Typically, it may be desirable to couple together discrete RF dies such as PAs, switches, etc. on a RF SiP. As noted previously, the SiP may use wire-bonds to connect the RF dies first to the package, and then through package interconnects to other passive components, active components, dies, etc. Typically, legacy solutions may use planar two-dimensional (2D) integration schemes, employing semiconductor packaging techniques such as low-temperature co-fired ceramic (LTCC), organic materials, etc. to interconnect between the different components in the SiP. Architectures with up to 10 metal layers may be used while the second level interconnect (SLI) may be a ball grid array (BGA), a land grid array (LGA), or some other type of interconnect. Passive devices such as resistors, inductors, capacitors, etc. may be mounted as surface mount devices (SMDs) on or in the package substrate. A typical RF SiP may have as many as 40 SMDs. If high-Q inductors are desired, those inductors may be placed on or in the outermost metal layers of the SiP, while lower-Q inductors may utilize up to 4 metal layers of the package substrate. The SiP may be overmolded to protect the devices from environmental conditions such as heat, physical damage, humidity, etc. One EMI solution may include a conductive thin layer of copper that covers the entire outer surface of the SiP and is connected to ground layers of the SiP, resulting in a sort of "Faraday cage." Furthermore, wire-bonds may be used to shield specific devices from interference while via walls inside the package may further help for cross-talk reduction. A thermal solution may be implemented using an array of thermal vias inside the packaging substrate because the solution may use a face-up approach (i.e., the active side of the dies facing away from the package substrate) for assembling the PAs in the system with wire-bonds for their interconnect to the package substrate. Other dies (e.g., integrated passive devices (IPDs), switches, digital logic, etc.) may also be placed on the package, and it may be desirable to connect those other dies to the rest of the electronics in the system.

However, legacy approaches may have one or more undesirable aspects. For example, legacy approaches may utilize discrete AWR dies (i.e., separate dies for each filter or each bandwidth), which may lead to an increased form factor due to the resultant die-to-die spacing design rules.

Because discrete dies may be used, matching networks may be desired to interconnect the discrete dies. The matching networks may be implemented on the package substrate, which may lead to an increased form factor. Additionally, the interconnect may happen on the package, which may lead to a higher layer count for the package substrate, resulting in increased z-height and manufacturing cost.

Individual EMI shielding of the AWR die may not occur in legacy designs. Rather, wire-bonds may be used for shielding. The wire-bonds may loop over the dies that need to be shielded. This approach may lead to an increase in package area due to design rules on how the wire can be guided to loop over the die. Specifically, if wire-bonds are used for RF shielding, they may noticeably increase SiP z-height.

With respect to thermal solutions (especially for face-up mounted dies) heat may be only extracted through the die into the substrate onto which the die is mounted. For example, the heat may be extracted using a ground via array or metal slug. This solution may render layers below the die shadow un-usable with respect to signal routing. In the future, with increasing PA performance or, in general, performance of the RF dies, this heat extraction path may not be sufficient. However, because face-up die interconnects to the package are wire-bonds in legacy solutions, it may be difficult to extract heat from the top of the dies. Extraction of heat through the top would have advantages for these dies, because a heat extraction mechanism would likely be close to the active elements (i.e., transistors) of the die, and may be enabled using flip-chip (FC) PA dies.

To address one or more of the above-described disadvantages, embodiments herein may relate to the integration of more than one filter on a single AWR die. The respective filters may be shielded on the AWR die using the metal layers and vias of the AWR die, as well as a lid element. Embodiments may lead to a smaller form factor and increased EMI shielding between individual filters. In addition, embodiments herein may relate to an architecture where the shielding ground layers on the AWR die are extended and connected to the ground layers of the package substrate, its external EMI shield, and active dies of the SiP. These connections may further reduce RF SiP cross-talk between different components of the SiP.

Generally, embodiments may lead to a reduction of total X-Y area of the SiP. Moreover, with the use of flip-chip dies for all the dies included in the SiP, the total z-height of the SiP may be reduced. Increased functionality integration on a single die may lead to a reduction in the number of packaging layers needed as well as a reduction of interstage matching circuits and hence lower interconnect losses. Therefore, it may result in reduction of both z-height and X-Y area of the SiP. Metal interconnect layers on the AWR die may create EMI shields, which may lead to increased EMI tolerance. The Z-height of the overall SiP may be further reduced because EMI measures may use the metal layers and vias of the AWR die instead of the above-described wire-bonds. The SiP or the AWR die may also exhibit better thermal performance with an added thermal path through the top side of the die using a heat spreader.

FIG. 1 depicts an example of the integration of more than one filter on a single AWR die. FIG. 1 may further depict an example of individual EMI shielding of each filter. One filter may have or relate to a first bandwidth (e.g., Band A), and another filter may have or relate to a second bandwidth (e.g., Band B). For bands A and B, several resonators (e.g., 8-10) may be connected together on die to achieve a certain filter specification. These resonators may be implemented using a piezo layer, and may be released structures. As used herein, the term "released structure" may refer to a structure that includes cavities on both sides of the resonator, and resulting in a suspended-type structure. Individual shielding of each of the filters may follow through the metallization on top of the resonators (e.g., the die interconnect layers). These vias and metal layers may need to surround the entire filter, and eventually connect to the die seal ring, which may serve as a means to hermetically seal the AWR die. The top lid/cap die may include the same seal ring shape, and may be assembled at a top level of the AWR die. The lid may also incorporate through-silicon vias (TSVs) where not only the ground/seal ring layer is connected to, but also the signals of the AWR die that need to be connected to other elements of the package (e.g., inductors implemented in internal package layers). In this manner, various sides of the filter, as well as the top face of the filter die, may be shielded against EMI. To achieve full EMI shielding, it may be desirable for the lower face of the AWR die to be shielded as well, and connected to ground layers in the AWR and the lid. This connection may be achieved if another shielding layer below the resonators is created as depicted in FIG. 1. Specifically, a backside metallization (BSM) layer may be enabled that is contacted through TSVs and connect to ground (and thereby others of the EMI structures). Generally, the TSVs, the BSM layer, and the subsequent wafer thinning may be created prior to fabrication of the resonators.

More specifically, FIG. 1 depicts a simplified cross-sectional view of an example multi-filter AWR die 100, in accordance with various embodiments. The AWR die 100 may include a lid 105 and a die body 110. The die body 110 may include an interlayer dielectric material 120 which may be, for example, silicon dioxide or some other material. The die body 110 may further include a substrate material 125 which may be, for example, silicon or some other material.

The die body 110 may further include a BSM layer 130. The BSM layer 130 may be or include a material such as titanium, nickel, gold, tantalum, some other similar material, or some other combination or alloy thereof. The BSM layer 130 may cover all or a portion of the backside of the die body 110 as depicted. As may be seen, the BSM layer 130 may include a number of BSM couplings 135 which may be, for example, vias of a conductive material. The BSM couplings 135 may be formed of the same material as the BSM layer 130, or a different conductive material.

The die body 110 may further include a plurality of filters such as filters 197a and 197b (collectively, "filters 197"). The filters 197 may be filters implemented with a plurality of AWRs. As described above, the filters 197 may each include one or more resonators (not depicted for the sake of lack of clutter of the Figure) which may be selected, coupled, or tuned in such a way as to tune specific characteristics of each of the filters 197. For example, filter 197a may have or relate to a first RF bandwidth related to a first span of frequencies (e.g., Band A), and filter 197b may have or relate to a second RF bandwidth related to a second span of frequencies (e.g., Band B). In other words, filter 197a may be configured to selectively pass or filter signals having frequencies within the first span of frequencies (Band A), and filter 197b may be configured to selectively pass or filter signals having frequencies within the second span of frequencies (Band B). The resonator(s) of the filter 197a may be selected to tune filter 197a to Band A, while the resonator(s) of filter 197b may be selected to tune filter 197b to Band B.

Each of the filters 197 may include a piezo layer 145 that is suspended. That is, the piezo layer 145 may have a cavity 140 on either side of the piezo layer 145. As depicted in FIG. 1, the cavity 140 may extend into the substrate material 125 as well as the interlayer dielectric material 120. However, it will be understood that in some embodiments the cavity 140 may occupy more space of the interlayer dielectric material 120 than the substrate material 125 (or vice-versa) or, in some embodiments, be positioned wholly within the interlayer dielectric material 120 or the substrate material 125.

The die body 110 may further include a number of conductive elements such as pads, traces, vias, etc. Specifically, the die body 110 may include shield vias 150, shield pads 155, and shield traces 160. The shield vias 150, shield pads 155, and shield traces 160 may be collectively referred to herein as "shield elements." The die body 110 may further include metal vias 170, metal pads 173, and metal traces 165. The vias 170, pads 173, and traces 165 may be referred to herein as "other conductive elements." The various shield elements and other conductive elements may be formed of the same material as one another. Specifically, the shield elements and other conductive elements may be formed of gold, copper, or some other material. However, as can be seen, the shield elements such as the shield via 150, the shield pad 155, and the shield trace 160 may generally surround the filters 197a and 197b. In some embodiments, the shield elements may completely surround the filters to provide an EMI shield. In some embodiments, as will be described below with respect to FIG. 2, the shield elements may form a unitary structure that fully surrounds the filters 197. In other embodiments, the shield elements may include a number of elements such as vias, traces, pads, etc. that are not a unitary structure but are spaced closely together enough to provide EMI protection to the filters 197. The other conductive elements such as the metal pad 173, the metal trace 165, and the metal via 170 may be coupled with various elements of the AWR die 100 and provide routing of power, data signals, ground coupling, etc. within the AWR die 100 or between elements of the AWR die 100 and a package substrate to which the AWR die 100 is coupled.

The die body 110 may further include a number of pads 175 and interconnects 180 that are coupled with the shield elements and other conductive elements. The pads 175 may be formed of a metal or conductive material such as copper, gold, or some other conductive material. It will be understood that although pads 175 are described herein as "pads," in some embodiments they may be considered to be "pillars," "bumps," or some other conductive coupling. The interconnects 180 may be, for example, balls of a BGA, elements of a solder grid array (SGA), a grid of copper pillars with solder, or some other type of interconnect element. The interconnects 180 may be used to couple the lid 105 with the die body 110.

The lid 105 may include metal vias 195 and shield vias 190 which may be respectively similar to metal via 170 and shield via 150. The vias 190 and 195 may be positioned in a lid material 115 which may be, for example, silicon, ceramic, glass, or some other similar material. As can be seen, the metal vias 195 and shield vias 190 may span the entirety of the height of the lid 105. The metal via 195 may couple with the die body 110 at one side of the lid 105 (for example, the other conductive elements of the die body 110 as described above), for example by way of interconnects 180, and another element of an electronic device such as a package substrate of a microelectronic package, and allow for transmission of communication or power signals between the die body 110 and the package substrate. Similarly, the shield via 190 may couple with the lid shielding layer 185a at one side of the lid 105, for example using interconnects 180, and the package substrate (or some other element) at the other side of the lid 105. Specifically, the shield via 190 may be communicatively coupled with a ground plane of the package substrate, a ground of the die body 110, or some other ground connection, which may allow for the shield via 190 to provide further EMI shielding through the lid 105.

As noted above, the lid 105 may further include lid shielding layers 185a and 185b (collectively, "lid shielding layer 185"). The lid shielding layer 185a may couple with the interconnects 180 that are coupled, by way of pads 175, with the shield elements of the die body 110. The lid shielding layer 185b may be to couple the lid 105, or the die 100 in general, with interconnects of a package substrate as will be described in further detail with respect to, for example, FIG. 6. The lid shielding layer 185 may be formed of a conductive material similar to that described with respect to the pads 175 or the shield elements. Specifically, the lid shielding layer 185 may be gold, copper, or some other conductive material.

Similarly, the lid 105 may include pads 186a and 186b (collectively "pads 186") that are formed of a conductive material such as gold, copper, etc. The pads 186a may couple with interconnects 180 that are communicatively coupled with, e.g., metal via 170, metal pad 173, metal trace 165, etc. Similarly, the pads 186b may be positioned on the opposite side of the lid 105 and may be configured to couple with interconnects of a package substrate as described in further detail.

As described above with respect to the shield elements of the die body 110, the lid shielding layer 185 may be a unitary ring-shaped piece of material that at least partially surrounds the filters 197. In other embodiments, the lid shielding layer 185 may be made up of a number of discrete elements such as pads that are spaced closely enough together to provide EMI shielding to the filters 197. Although lid shielding layers 185a/185b and pads 186a/186b are being depicted as being generally identical to one another, in some embodiments one or more of the lid shielding layers 185a/185b and pads 186a/186b may vary from another one of the lid shielding layers 185a/185b and pads 186a/186b in terms of dimensions, material, etc. These variations are depicted in further detail with respect to, for example, FIG. 3. Similarly, the interconnects 180 and pads 175 that are coupled with the shield elements of the die body 110 may be a generally ring-shaped unitary piece of material that surrounds the filters 197, or they may be a plurality of discrete pads, interconnects, or both, that are spaced closely enough together to provide EMI shielding to the filters 197.

As may be seen, the BSM couplings 135 may be communicatively coupled with the shield elements of the die body 110. In general, the various elements that make up the EMI shield for the filters 197 are shaded light grey (as opposed to the darker grey of the other conductive elements of the die body 110). Therefore, as may be seen in FIG. 1, the filters 197 may be shielded on the bottom side of the filters 197 by the BSM layer 130. The filters 197 may further be shielded on the sides of the filters 197 by the shielding elements, and the shielding may extend through the lid 105, for example by way of shield vias 190.

Figure 2:
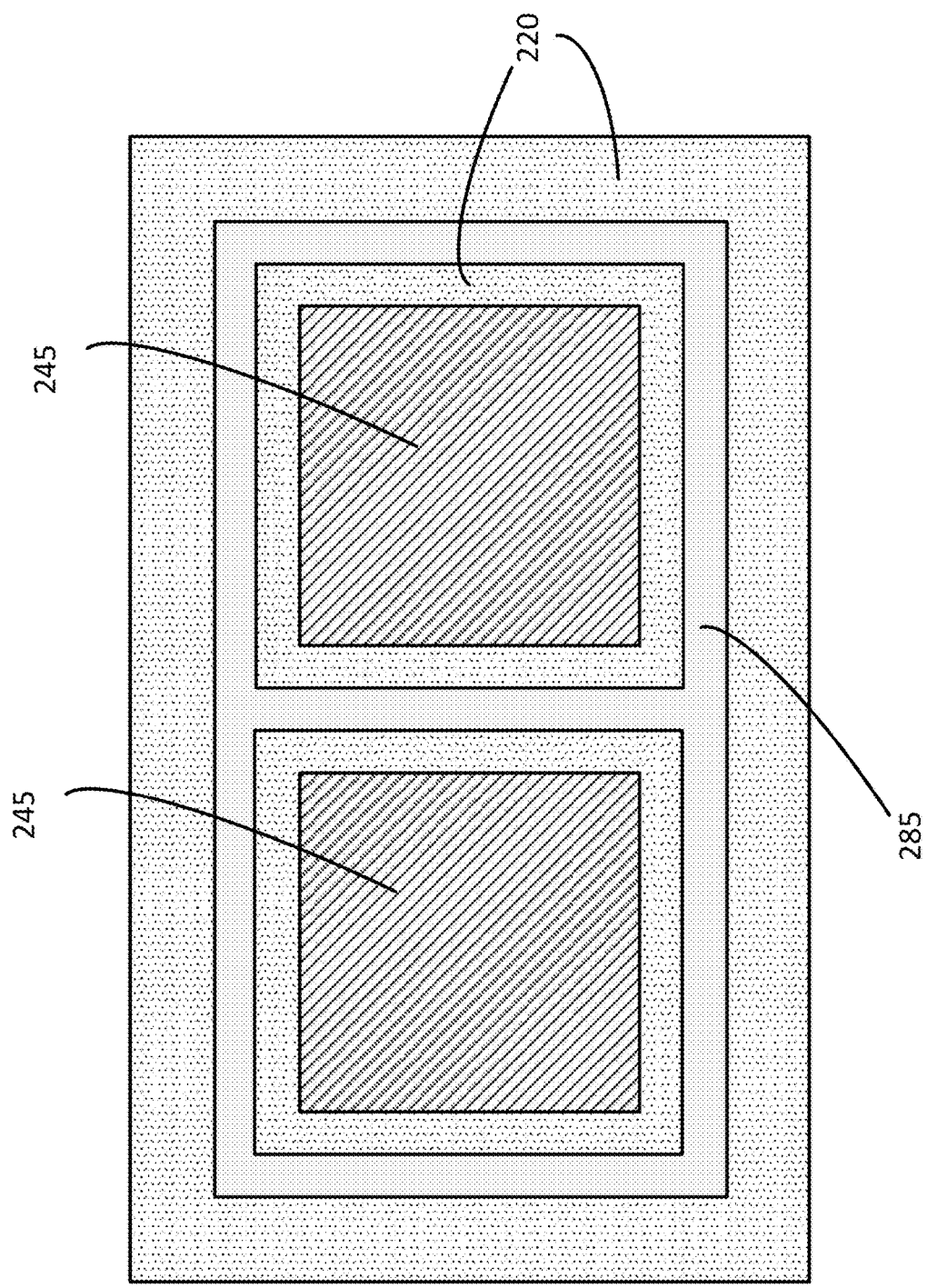
FIG. 2 depicts a simplified top-down view showing an example EMI shielding configuration which may be used in a multi-filter AWR die, in accordance with various embodiments.

FIG. 2 depicts a simplified top-down view showing an example EMI shielding configuration which may be used in a multi-filter AWR die, in accordance with various embodiments. It will be understood that the embodiment of FIG. 2 is not intended as a specific cross-sectional view taken along a given line of the AWR die 100, but rather is intended to show, at a high-level, an example configuration of an EMI shielding structure. As such, certain elements such as vias (e.g., vias 195) or other elements are not shown for the sake of clarity of the Figure.

As may be seen, FIG. 2 depicts an interlayer dielectric 220, which may be similar to, and share one or more characteristics with, interlayer dielectric 220. FIG. 2 may also depict a number of piezo layers 245 which may be similar to, and share one or more characteristics with, piezo layers 145.

FIG. 2 further depicts an EMI structure 285 that surrounds each of the piezo layers 245. The EMI structure 285 may be formed of, or include, elements such as the shield pads 155, shield vias 150, shield traces 160, etc. Similarly, the EMI structure 285 may include elements such as the BSM coupling 135. The EMI structure 285 may also include elements such as lid shielding layer 185. As discussed above, the various elements of the EMI structure 285 may generally surround, and provide EMI protection to, the piezo layer 245 which may make up a filter such as one of filters 197.

It will be understood that the configuration of FIG. 2 is intended as an example configuration, and other EMI structures may vary from that depicted. For example, in some embodiments the EMI structure may not be a unitary element, as described above, but rather may include a number of discrete elements (pads, traces, vias, etc.) that are spaced together such that they may still provide EMI protection. In some embodiments, the EMI structure that surrounds each of the filters (e.g., each of the piezo layers 245) may not be a unitary structure that shares a common wall, but rather may be two separate structures. In some embodiments, the EMI structure may be shaped differently (e.g., have a rectangular cross-section, a triangular cross-section, a non-uniform cross-section, etc.). In some embodiments, the EMI structure may not have uniformly linear aspects but rather may occupy different spaces at different levels of the die body based on trace, via, or pad routing. Other variations may be present in other embodiments.

Figure 3:
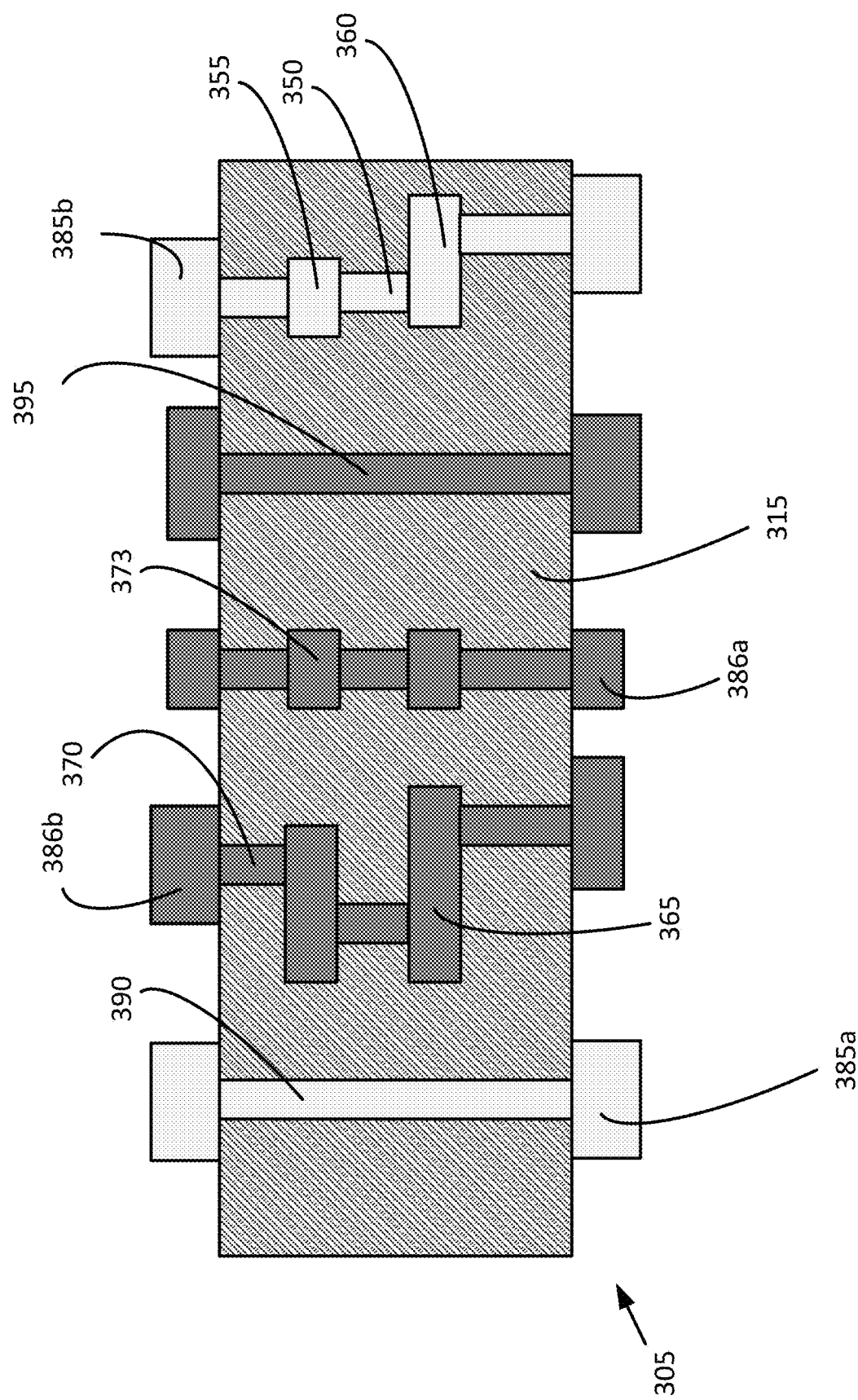
FIG. 3 depicts a simplified cross-sectional view of an example lid which may be used in a multi-filter AWR die, in accordance with various embodiments.

In some embodiments, the lid of the AWR die may include additional interconnect layers. FIG. 3 depicts an example of such a lid. Specifically, FIG. 3 depicts a simplified cross-sectional view of an example lid 305 which may be used in a multi-filter AWR die, in accordance with various embodiments.

The lid 305 may be similar to, and share one or more characteristics of, lid 105 of FIG. 1. The lid 305 may include a lid material 315 which may be similar to, and share one or more characteristics of, lid material 115. The lid 305 may further include lid shielding layers 385a and 385b, pads 386a and 386b, metal via 395, and shield via 390 which may be respectively similar to, and share one or more characteristics of, lid shielding layers 185a and 185b, pads 186a and 186b, metal via 195, and shield via 190. Specifically, as may be seen, the metal via 395 and the shield via 390 may traverse the entirety of the lid 305. The lid shielding layers 385a and 385b may be collectively referred to as "lid shielding layers 385," and the pads 386a and 386b may be collectively referred to as "pads 386."

As previously discussed, in some embodiments the lid shielding layers 385 and the pads 386 may be different from one another. As one example which may be seen in FIG. 3, the pads 386 may vary from one another in terms of both height and width. Although not specifically depicted, the lid shielding layers 385 may likewise vary. Additionally, as noted, the pads 386 and the lid shielding layers 385 may vary from one another in terms of the material used (e.g., be formed of different materials). Other variations may be present in other embodiments.

In addition, or as an alternative, to a metal via 395 or a shield via 390, the lid 305 may include a plurality of conductive elements positioned within various interconnect layers of the lid material 315. For example, the lid 305 may include a number of shield vias 350, shield pads 355, and shield traces 360 which may be respectively similar to, and share one or more characteristics with, shield vias 150, shield pads 155, and shield traces 160. Additionally, the lid 305 may include a number of metal traces 365, metal vias 370, and metal pads 373 which may be respectively similar to, and share one or more characteristics with, metal traces 165, metal vias 170, and metal pads 173.

The various metal traces, vias, and pads 365, 370, and 373 may allow for communication of signals such as power or data signals between a device coupled to one side of the lid 305 and a device coupled to the other side of the lid 305 in a manner similar to that of metal via 195. In this embodiment, the lid 305 may further include one or more active or passive devices (e.g., transistors, resistors, capacitors, inductors etc.) either positioned in or on the lid (not pictured for the sake of clarity of the Figure). The additional elements may be coupled with one or both of the various metal traces, vias, and pads 365, 370, and 373, the shield vias, pads, and traces 350, 355, and 360, the metal via 395, or the shield via 390.

The various shield vias, pads, and traces 350, 355, and 360 may be coupled with ground (e.g., by way of a ground plane or ground connection in the lid 305, in a die body to which the lid 305 is coupled, in a package substrate to which the lid is coupled, or some other ground coupling) and provide EMI shielding in a manner similar to that described with respect to shield via 190.

In some embodiments, before resonator fabrication, a blanket metal shielding layer may be deposited on the semiconductor wafer, which may further include a barrier layer on top. Afterwards, vias may be opened to connect this layer to ground (e.g., to the shield elements of the die body). The piezo-material may then be deposited and the resonator fabrication may be initiated.

Figure 4:
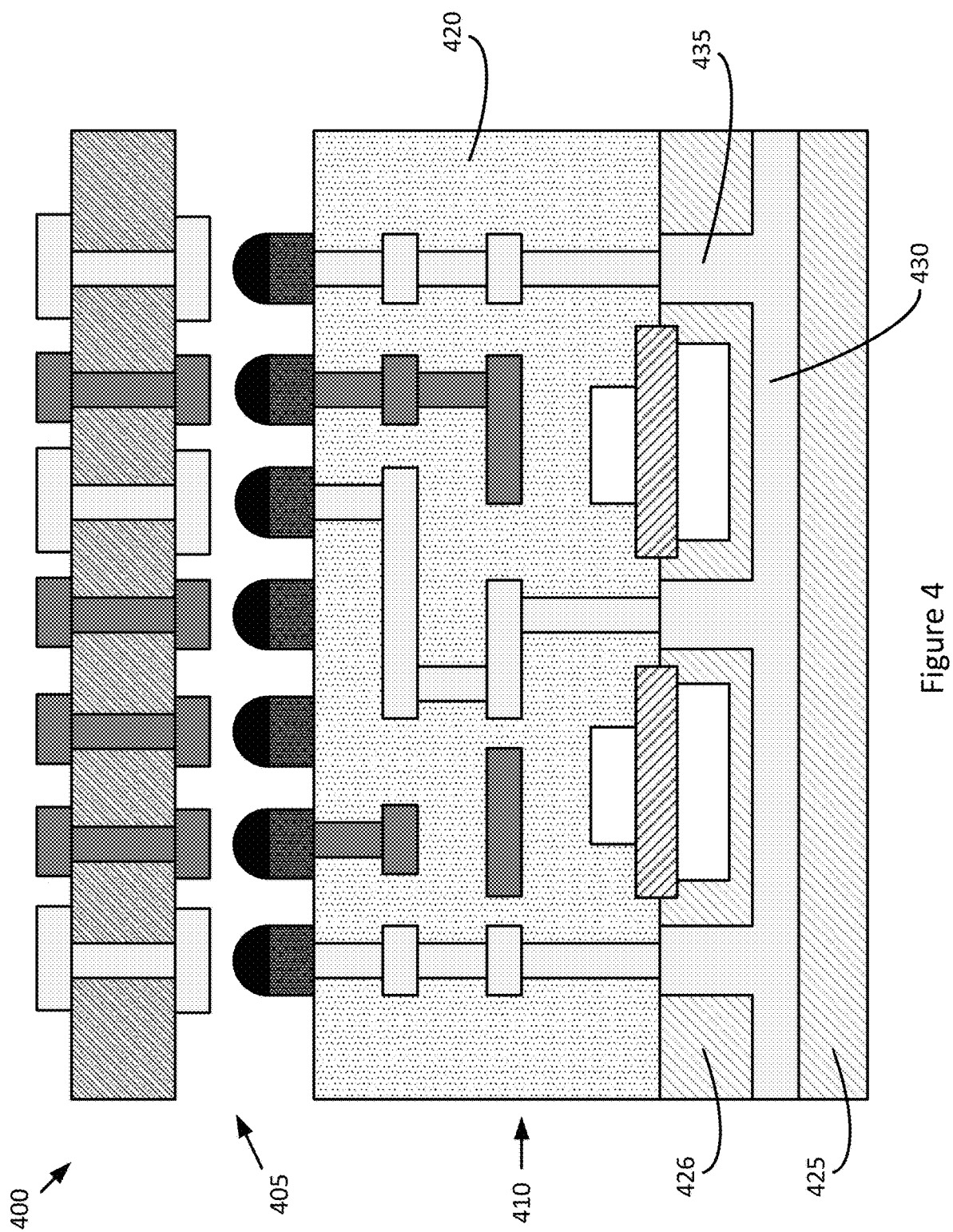
FIG. 4 depicts a simplified cross-sectional view of an alternative example multi-filter AWR die, in accordance with various embodiments.

FIG. 4 depicts an example where a blanket metal shielding layer may be deposited. Specifically, FIG. 4 depicts a simplified cross-sectional view of an alternative example multi-filter AWR die 400, in accordance with various embodiments. The AWR die 400 may be similar to, and share one or more characteristics with, die 100. Specifically, the AWR die 400 may include a lid 405 and a die body 410 which may be similar to, and share one or more characteristics with, lid 105 and die body 110. The die body 410 may include an interlayer dielectric 420 and a substrate 425 which may be similar to, and share one or more characteristics with, interlayer dielectric 120 and substrate 125.

Rather than including a BSM layer such as BSM layer 130, the die 400 may include a metallization layer 430. The metallization layer 430 may be formed of a conductive material such as copper, gold, etc. The metallization layer 430 may be deposited (e.g., through spray deposition or some other deposition technique) on the substrate 425. The metallization layer 430 may include metallization layer couplings 435. Generally, the metallization layer 430 and the metallization layer couplings 435 may be similar to, and share one or more characteristics with, metallization layer BSM layer 130 and BSM layer couplings 135. Specifically, the metallization layer 430 may be coupled with ground and serve as an element of an EMI shield structure for filters of the AWR die 400 (e.g., filters similar to filters 197). Similarly, the metallization layer couplings 435 may communicatively couple the metallization layer 430 to shield elements within the die body 410 as depicted in FIG. 4.

In some embodiments, the AWR die 400 may further include a barrier layer 426 positioned on top of the metallization layer 430. In some embodiments, the barrier layer 426 may be similar to, and share one or more characteristics, with the substrate 425. Specifically, the barrier layer 426 and the substrate 425 may be formed of the same material as depicted in FIG. 4. In other embodiments, the barrier layer 426 and the substrate 425 may be formed of different materials from one another. In some embodiments, the barrier layer 426 may be formed of a material similar to that of interlayer dielectric 420, or some other material which may serve as a dielectric barrier between the metallization layer 430 and other elements of the die body 410.

In some embodiments, similar EMI shielding techniques may be used in a die that has a local lid rather than a global lid. As used herein, a "global" lid may refer to a lid that covers most or all of the face of the die body and all of the filters of the multi-filter AWR die. By contrast, a "local" lid may refer to a lid that only covers a portion of the face of the multi-filter AWR die. The local lid may only cover a single filter or a portion of the filters of the multi-filter AWR die. In some embodiments, the AWR die may be a combination of active and passive components where the passive components (e.g., the filters) may need a hermetic seal or lid, while the active devices may only need an EMI shield that can be enabled using metal elements of the die body that are coupled with ground.

Figure 5:
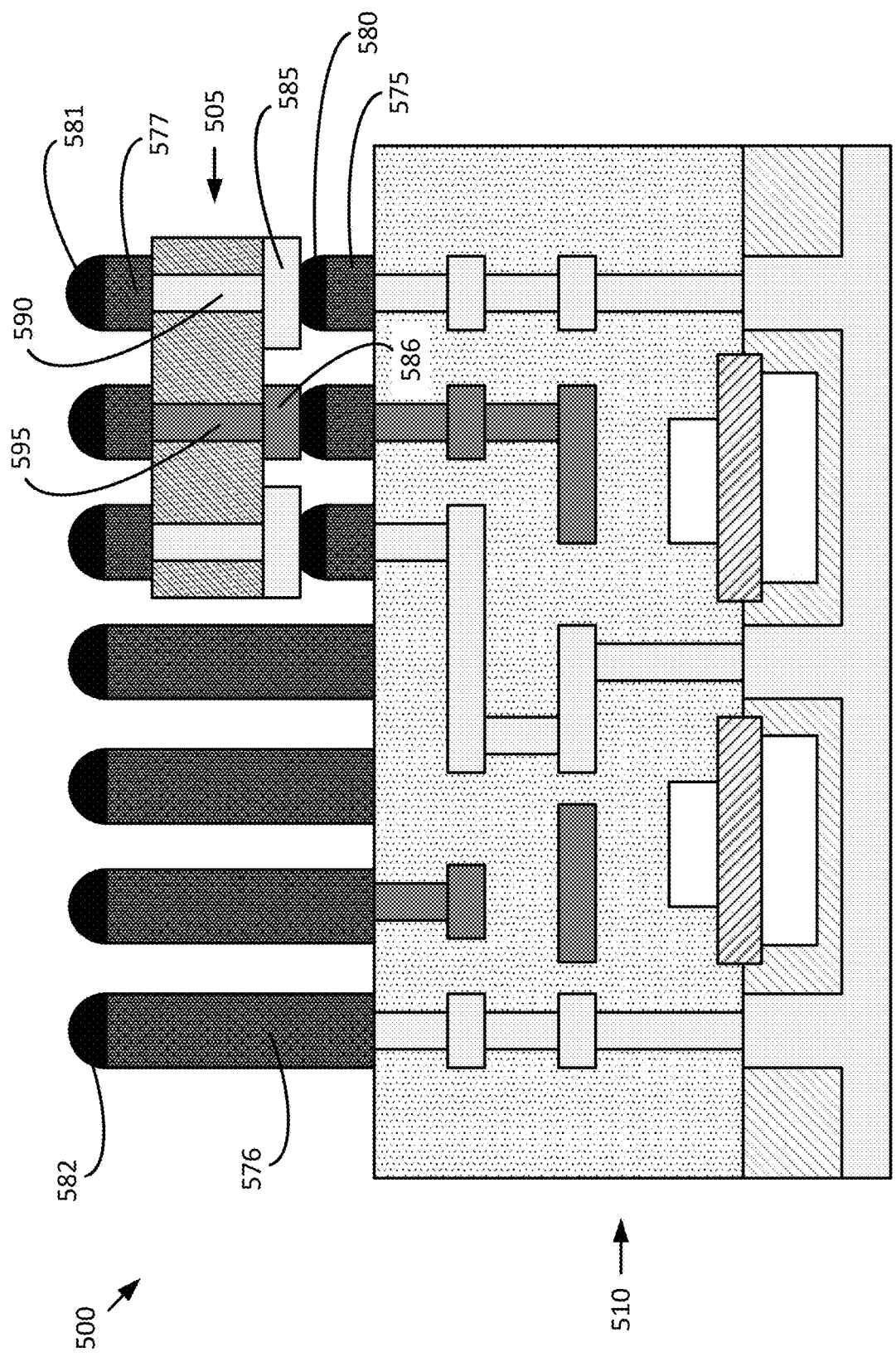
FIG. 5 depicts a simplified cross-sectional view of an alternative example multi-filter AWR die, in accordance with various embodiments.

FIG. 5 depicts an example of a multi-filter AWR die with a local lid. Specifically, FIG. 5 depicts a simplified cross-sectional view of an alternative example multi-filter AWR die 500, in accordance with various embodiments. The AWR die 500 may be similar to, and include one or more characteristics of, the AWR die 100. Specifically, the AWR die 500 may include a die body 510 which may be similar to, and share one or more characteristics with, die body 110. In contrast to FIG. 1 or other Figures herein, FIG. 5 depicts the AWR die 500 with a lid 505 coupled with the die body 510.

The lid 505 may be generally similar to, and share one or more characteristics with, lid 105 of FIG. 1. For example, the lid 505 may include shield vias 590 and metal vias 595 which may be respectively similar to, and share one or more characteristics with, shield vias 190 and metal vias 195. The lid 505 may further include a lid shielding layer 585 which may be similar to, and share one or more characteristics with, lid shielding layer 185.

The lid 505 may be coupled with the die body 510 by pads 575 and interconnects 580 which may be similar to, and share one or more characteristics with, pads 175 and interconnects 180. Specifically, as may be seen, the interconnects 580 may be coupled with the lid shielding layer 585, thereby providing a connection between the shield elements of the die body 510 (e.g., the various shield vias, traces, pads, etc. of the die body as described with respect to FIG. 1) and the shield via 590.

The lid 505 may additionally include one or more pads 586 that are coupled with the metal via 595. The pads 586 may be similar to, for example, pads 575. Specifically, the pads 586 may be formed of a conductive material such as copper, gold, etc. However, it will be understood that pad 586 is shaded differently than pads 575 for the sake of illustrating the signal pathway for signal or power elements of the AWR die 500. As may be seen, the pad 586 may be coupled (by way of pads 575 and interconnects 580) with conductive elements of the die body 510 (similar to conductive elements such as the metal vias, traces, or pads described with respect to FIG. 1.) The pad may further be coupled with the metal via 595. In this way, the metal vias 595 may be communicatively coupled with signal or power elements of the die body 510.

The lid 505 may further include pads 577 that are coupled with additional interconnects 581. The pads 577 may be generally similar to, and share one or more characteristics, with pads 575. Similarly, the interconnects 581 may be similar to, and share one or more characteristics with interconnects 580. Specifically, the pads 577 may be formed of a conductive material such as gold, copper, etc. The interconnects 581 may be interconnects such as elements of a BGA or an SGA, or some other type of interconnect. In some embodiments, the interconnects 581 may be the same type of interconnect as interconnects 580, while in other embodiments interconnects 580 and 581 may be different types of interconnects. In some embodiments, interconnects 580 may be sized, shaped, or spaced differently than interconnects 581 (e.g., bigger or smaller, having a greater or smaller pitch, etc.) Similarly, the pads 577 may have the same or different size, shape, pitch, material than pads 575.

The AWR die 500 may further include pads 576 coupled with interconnects 582. The interconnects 582 may be similar to, and share one or more characteristics with, interconnects 580 or 581. Specifically, the interconnects 582 may be elements of a BGA or SGA, or a different type of interconnect. In some embodiments, the interconnects 582 may be the same type of interconnect as interconnects 580 or 581, while in other embodiments interconnect 582 may be a different type of interconnect than interconnects 580 or 581. In some embodiments, the interconnects 582 may be sized, shaped, or spaced differently than interconnects 580 or 581.

In some embodiments the pads 576 may be similar to, for example, pads 575. For example, the pads 576 may be a unitary element of a conductive material such as gold, copper, etc. In other embodiments, the pads 576 may be composed of two separate pads that are coupled to one another by a conductive pillar. In some embodiments, a mold material may be disposed over the die body 510 to generally encompass the various depicted pads, interconnect, the lid, etc. to provide additional structural support for the various elements. Similarly to other elements described herein, the pads 576 may be generally the same shape and have the same cross-section as other pads (e.g., pads 577 and 575), while in other embodiments the pads 576 may have a different size, shape, spacing, etc. than others of the pads.

Figure 6:
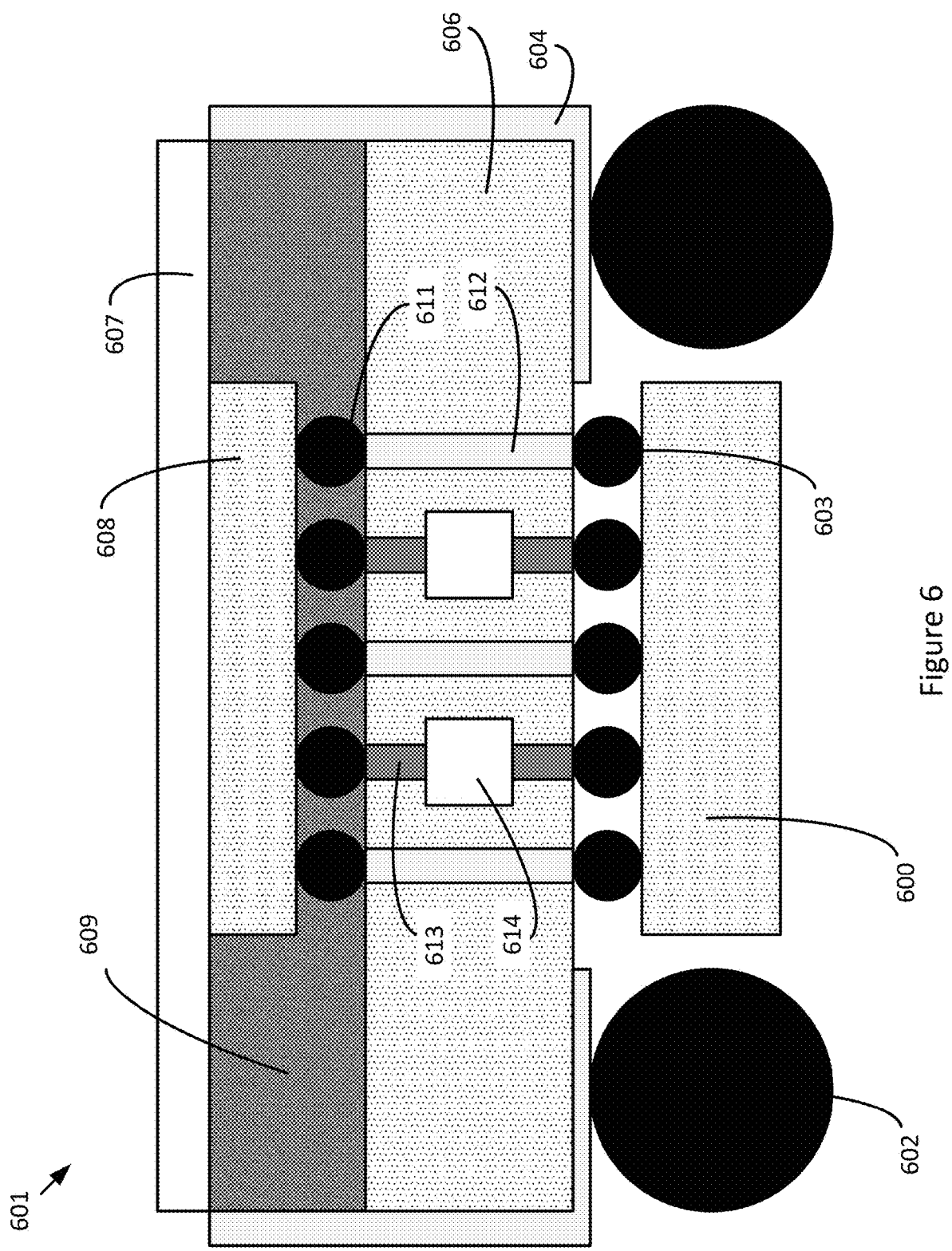
FIG. 6 depicts a simplified cross-sectional view of a microelectronic package which may include a multi-filter AWR die, in accordance with various embodiments.

FIG. 6 depicts an example microelectronic package in which the multi-filter AWR die and related EMI shielding may be implemented. Specifically, FIG. 6 depicts a simplified cross-sectional view of a microelectronic package 601 which may include a multi-filter AWR die 600, in accordance with various embodiments. It will be understood that in some embodiments the microelectronic package 601 may be referred to as a semiconductor package, a SiP, or by some other terminology. For the sake of discussion and consistency, the term "microelectronic package" will be used herein with respect to element 601. The AWR die 600 may be similar to, and share one or more characteristics with other AWR dies discussed herein such as AWR die 100. Generally, functionality of the AWR die 600 may be discussed with reference to elements of AWR die 100, however it will be understood that AWR die 600 may be or may include other AWR dies discussed herein, or elements thereof.

The microelectronic package 601 may include a package substrate 606. The package substrate 606 may be, for example, considered to be a cored or coreless substrate. The package substrate 606 may include one or more layers of a dielectric material which may be organic or inorganic. The package substrate 606 may further include one or more conductive elements such as vias, pads, traces, microstrips, striplines, etc. The conductive elements may be internal to, or on the surface of, the package substrate 606. Generally, the conductive elements may allow for the routing of signals through the package substrate 606, or between elements that are coupled to the package substrate 606. In some embodiments the package substrate 606 may be, for example, a printed circuit board (PCB), an interposer, a motherboard, or some other type of substrate.

An active die 608 may be coupled with the surface of the package substrate 606. The die 608 may be or include, for example, a processor such as a central processing unit (CPU), graphics processing unit (GPU), a core of a distributed processor, or some other type of processor. Alternatively, the die 608 may be include a memory such as a double data rate (DDR) memory, a nonvolatile memory (NVM), a volatile memory, a read-only memory (ROM), or some other type of memory or die. In some embodiments the die 608 may be or include a RF chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 608 may include one or more passive components such as capacitors, resistors, etc. The various active or passive components may be positioned within, partially within, or on the surface of the die 608.

The microelectronic package 601 may further include an integrated heat spreader (IHS) 607 that is coupled with the die 608. Generally, the IHS 607 may be formed of a piece of metal or some other thermally conductive element which may draw heat away from the active die 608 to a thermal solution such as a vapor chamber or some other thermal solution. Although not shown for the sake of clarity in the Figure, in some embodiments a thermal interface material (TIM) may be positioned between the active die 608 and the IHS.

The AWR die 600 may be coupled with the package substrate 606 by a number of interconnects 603 which may be referred to as first level interconnects (FLIs). The interconnects 603 may be generally similar to interconnects 582 or 581 of FIG. 5. Specifically, the interconnects 603 may be an element of a BGA, an element of an SGA, or some other type of interconnect. Similarly, the die 608 may be coupled with the package substrate 606 by interconnects 611 which may be similar to interconnects 603. Specifically, interconnects 611 may also be referred to as FLIs and may be, for example, an element of a BGA, an element of an SGA, or some other type of interconnect.

The package 601 may further include one or more additional interconnects such as interconnects 602, which may be referred to as SLIs. The interconnects 602 may be to couple the package 601 with another element of an electronic device of which the package 601 is a part such as a motherboard, an interposer, etc. Generally, the interconnects 602 may be elements of a BGA, an SGA, a pin grid array (PGA), a LGA, or some other type of interconnect. In some embodiments, the interconnects 602 may be larger than the interconnects 603 or 611 as depicted, while in other embodiments the interconnects 602 may be the same size as, or smaller than, interconnects 603 or 611.

The die 608 and interconnects 611 may be surround by a mold material 609. The mold material may be formed of a non-conductive material such as epoxy or some other material. Generally, the mold material 609 may help to provide structural support to the microelectronic package 601. The mold material 609 may further provide protection to the active die 608 or the package substrate 606 from physical damage, thermal or humidity-related damage, or some other type of damage. In some embodiments, the AWR die 600 and interconnects 603 may likewise be surround by a mold material.

The package substrate 606 may include a number of vias such as signal vias 613 and shield vias 612. The package substrate 606 may further include a number of inductors 614. The inductors 614 may be related to functionality of the AWR die 600. Specifically, the inductors 614 may be communicatively coupled with various filters of the AWR die such as filters 197. As may be seen, the inductors 614 may be positioned in the die shadow of both the active die 608 and the AWR die 600. That is, the inductors 614 may be positioned in a space generally adjacent to, and above or below, the active die 608 or the AWR die 600 as depicted. The inductors 614 may be coupled with the active die 608, the AWR die 600, or both by signal vias 613. The signal vias 613 may be similar to, for example, metal vias 195 or the conductive elements of the die body 110 such as the metal vias 170, metal trace 165, or metal pad 173. Specifically, the signal vias 613 may be configured to convey power or data signal through the package substrate 606, and between various elements of the package substrate 606. The signal vias 613 may be coupled with elements of the AWR die such as the metal vias/traces/pads 170/165/173 by way of the interconnects 603 or, more specifically, to the metal vias 195 of the lid 105 of the AWR die.

The shield vias 612 may be similar to, and share one or more characteristics with, shield vias 190 or the shield elements of die body 110. Specifically, the shield vias 612 may generally surround the inductors 614 or other elements of the package substrate. The shield vias 612 may be coupled with the shield elements of the AWR die such as the shield via 190 of the lid 105 of the AWR die and, through the lid, to other shield elements of the die body of the AWR die. In this way, the shield vias 612 may extend the EMI-shielded cavity through the AWR die into the package substrate, allowing the EMI-shielded cavity to include both one or more filters (e.g., filters 197) as well as one or more inductors 614. It is understood that a matching network that comprises a combination of inductors and capacitors may also be used in place of, or in addition to, inductor 614. The capacitors may be discrete embedded, metal finger capacitors or metal-insulator metal capacitors. In some embodiments, the shield vias 612 may be coupled with a ground plane or some other ground element of the package substrate 606 or the active die 608 (ground plane not shown to avoid additional Figure clutter). The ground plane (or other ground element) may extend generally laterally with respect to the orientation of FIG. 6, and thereby provide a "top" to the EMI-shielded cavity.

The package 601 may further include a metallization layer 604 located at least partially on the bottom or the side of the package 601 as depicted. The metallization layer 604 may be similar to the BSM layer 130 or the metallization layer 430. Specifically, the metallization layer 604 may be coupled with ground by way of interconnects 602, a ground plane of the package substrate 606, or some other ground coupling. The metallization layer 604 may at least partially surround the package 601 and provide additional EMI shielding to the package 601 and, for example, the inductors 614 or other elements of the package 601. It will be understood that although the metallization layer 604 is depicted as extending along the entirety of the height of the package 601, as well as being positioned between the package substrate 606 and the interconnects 602, in some embodiments the metallization layer 604 may extend only partially along the height of the package 601. Similarly, in some embodiments the metallization layer 604 may not be positioned between the package substrate 606 and the interconnects 602.

Generally, it will be understood that the depicted embodiments of FIGS. 1-6 are intended as example embodiments, and other embodiments may vary from those depicted. For example, the specific number, shape, or size of various elements may vary in other embodiments. Some embodiments may include combinations of depicted features. For example, the localized lid of FIG. 5 may be used with the embodiment of FIG. 4. In some embodiments, pads such as pads 175 that are depicted on the surface of an element such as the interlayer dielectric 120 may be positioned at least partially within the surface of the element. In some embodiment certain pads such as pads 586 may not be present. Certain pathways such as shield couplings or signal couplings that are depicted as only including a certain number of layers or being relatively linear may, in real-world embodiments, be significantly more complicated than depicted.

It will also be understood that not each and every element of each Figure may be numbered. For example, each of interconnects 180 or pads 175 may not be specifically numbered in FIG. 1. Similarly, certain elements of subsequent Figures such as FIG. 4 or 5 may not be re-numbered if the element is sufficiently numbered and described in FIG. 1 or some other Figure. However, it will be understood that elements that are generally identical to one another in terms of shape, shading, and placement, may be assumed to share similar characteristics unless specifically stated otherwise.

Figure 7:
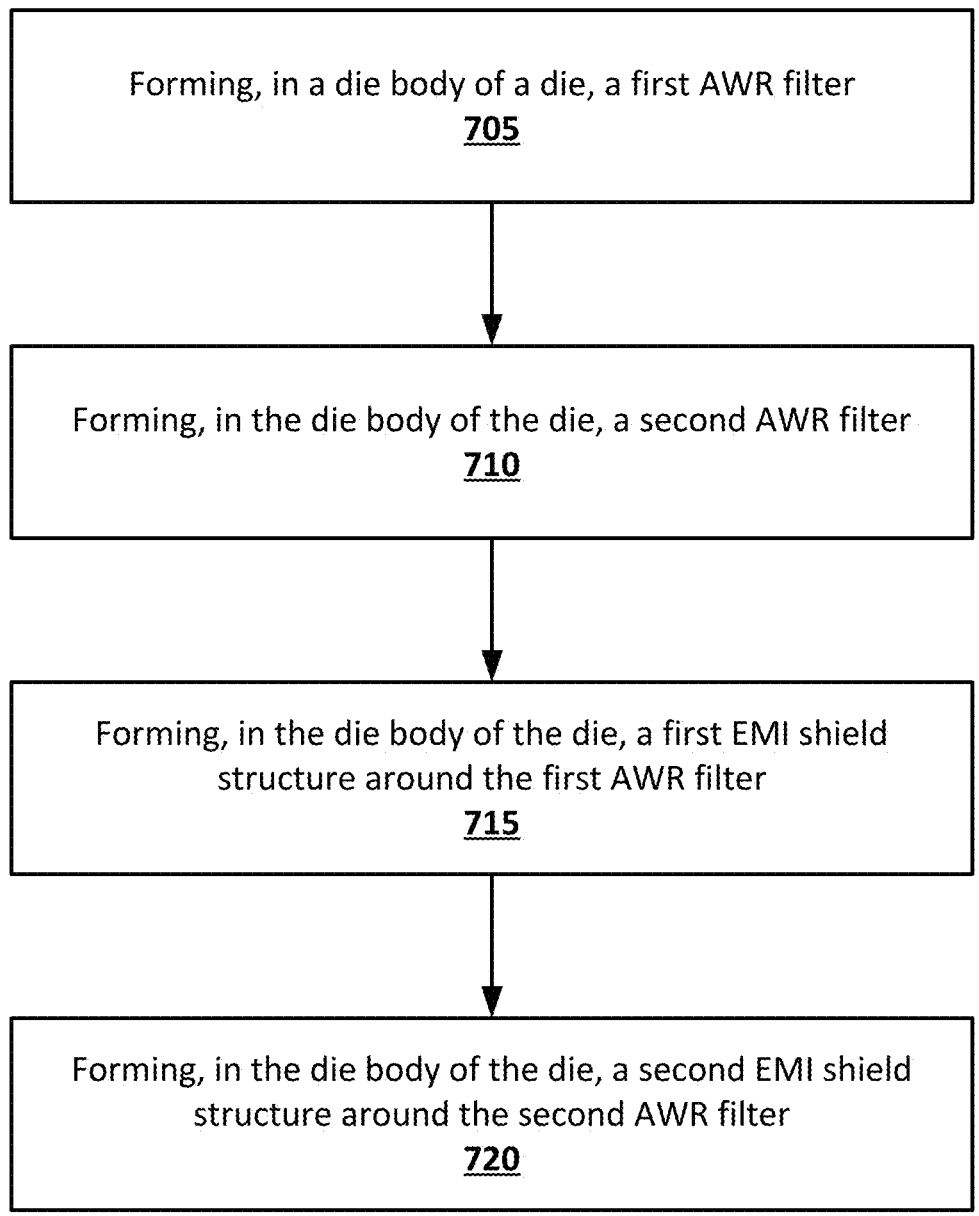
FIG. 7 depicts a simplified example technique by which a multi-filter AWR die may be manufactured, in accordance with various embodiments.

FIG. 7 depicts a simplified example technique by which a multi-filter AWR die may be manufactured, in accordance with various embodiments. Generally, the technique may be described with reference to the embodiment of FIG. 1. However, it will be understood that the technique may be applicable, in whole or in part, with or without modification, to other embodiments of the present disclosure.

The technique may include forming, at 705, in a die body of a die, a first AWR filter. The die may be similar to, for example, AWR die 100. The die body may be similar to, for example, die body 110. The AWR filter may be similar to, for example, filter 197a or filter 197b. Forming the filter may include forming a cavity such as cavity 140 in substrate 125, interlayer dielectric 120, or both. The cavity may be formed through lithographic etching, chemical etching, mechanical drilling, or some other technique. A piezo layer such as piezo layer 145 may be suspended within the cavity 140 as shown in FIG. 1, and one or more resonators may be coupled with the piezo layer as described above.

The technique may further include forming, at 710, in the die body of the die, a second AWR filter. The second AWR filter may be similar to, for example, filter 197a or filter 197b. The second AWR filter may be formed in a manner similar to that described with respect to the first filter. Generally, the first AWR filter and the second AWR filter may have, or be related to, different frequency bandwidths as described above.

The technique may further include forming, at 715, in the die body of the die, a first EMI shield structure around the first AWR filter. The technique may further include forming, at 720, in the die body of the die, a second EMI shield structure around the second AWR filter. The EMI shield structures may be similar to those provided by, for example, BSM layer 130, BSM coupling 135, shield vias 150, shield pads 155, shield traces 160, pads 175, interconnects 180, lid shielding layer 185, or other shield elements as described herein. The EMI shield structure may provide for an EMI-shielded cavity that generally surrounds the filters as described above.

It will be understood that this technique is intended as an example technique, and certain elements may be performed in a different order than depicted. For example, in some embodiments certain elements such as elements 705 and 710 may be performed concurrently with one another. Similarly, elements 715 and 720 may be performed prior to elements 705 and 710. In some embodiments, the technique may include additional elements, or one or more of the depicted elements may be removed or combined with another element. Other variations may be present in other embodiments.

Figure 8:
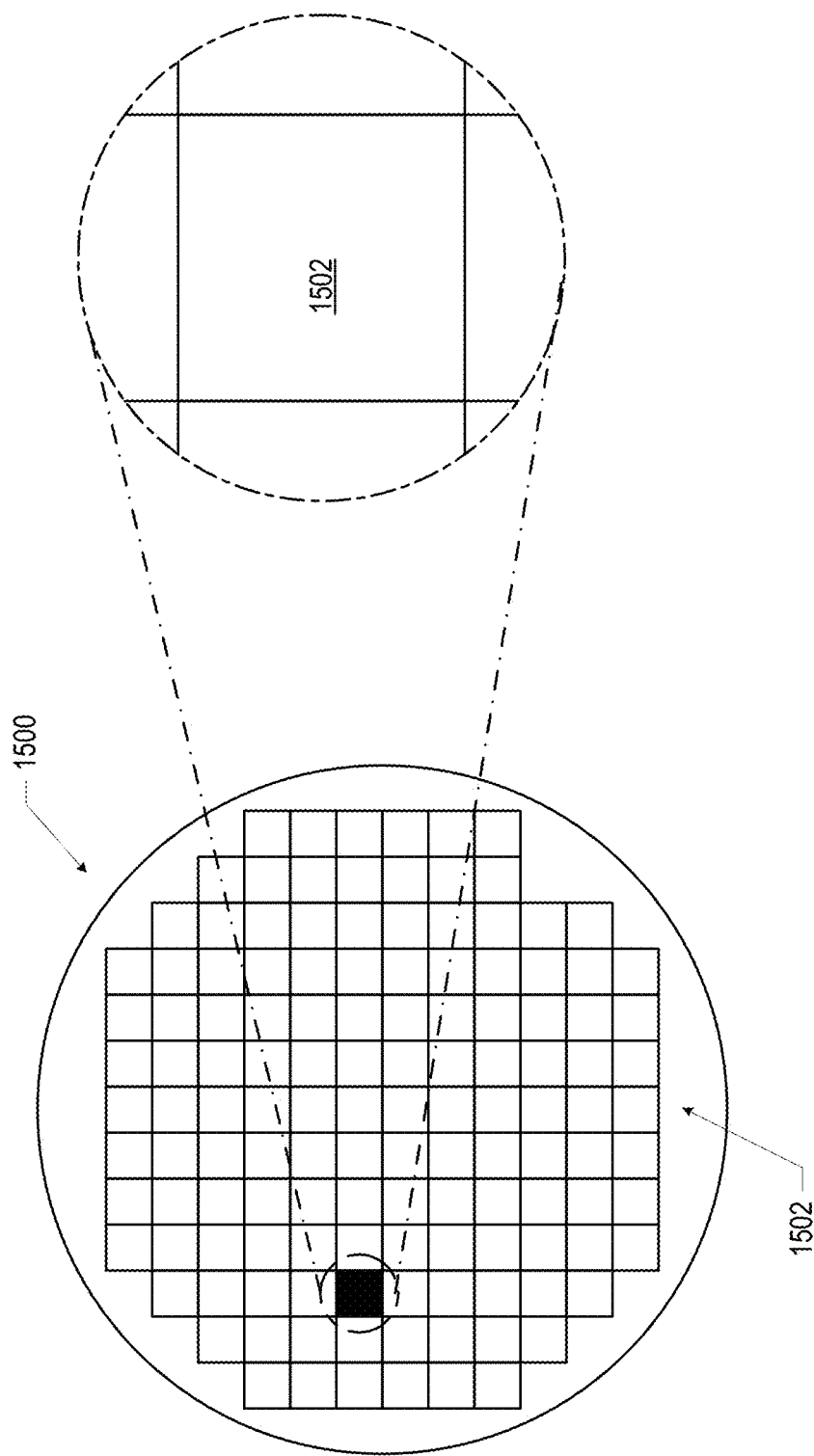
FIG. 8 is a top view of a wafer and dies that may include a multi-filter AWR die, in accordance with various embodiments.

FIG. 8 is a top view of a wafer 1500 and dies 1502 that may include one or more multi-filter AWR dies, or may be included in an IC package including one or more multi-filter AWR dies, in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may be an AWR die that includes one or more filters, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 9:
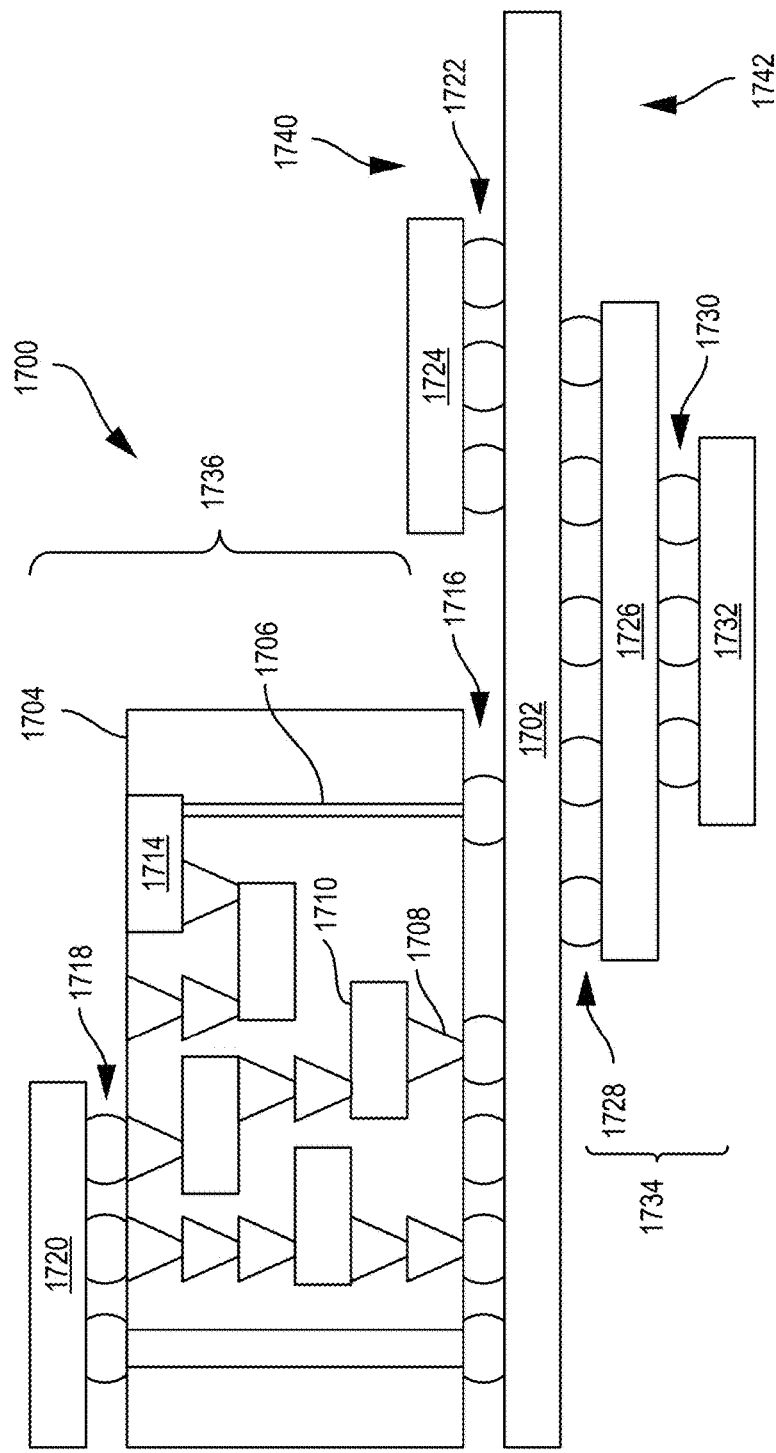
FIG. 9 is a side, cross-sectional view of an integrated circuit (IC) device assembly that may include a multi-filter AWR die, in accordance with various embodiments.

FIG. 9 is a side, cross-sectional view of an IC device assembly 1700 that may include one or more IC packages or other electronic components (e.g., a die) including one or more multi-filter AWR dies, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 8), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more multi-filter AWR dies.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
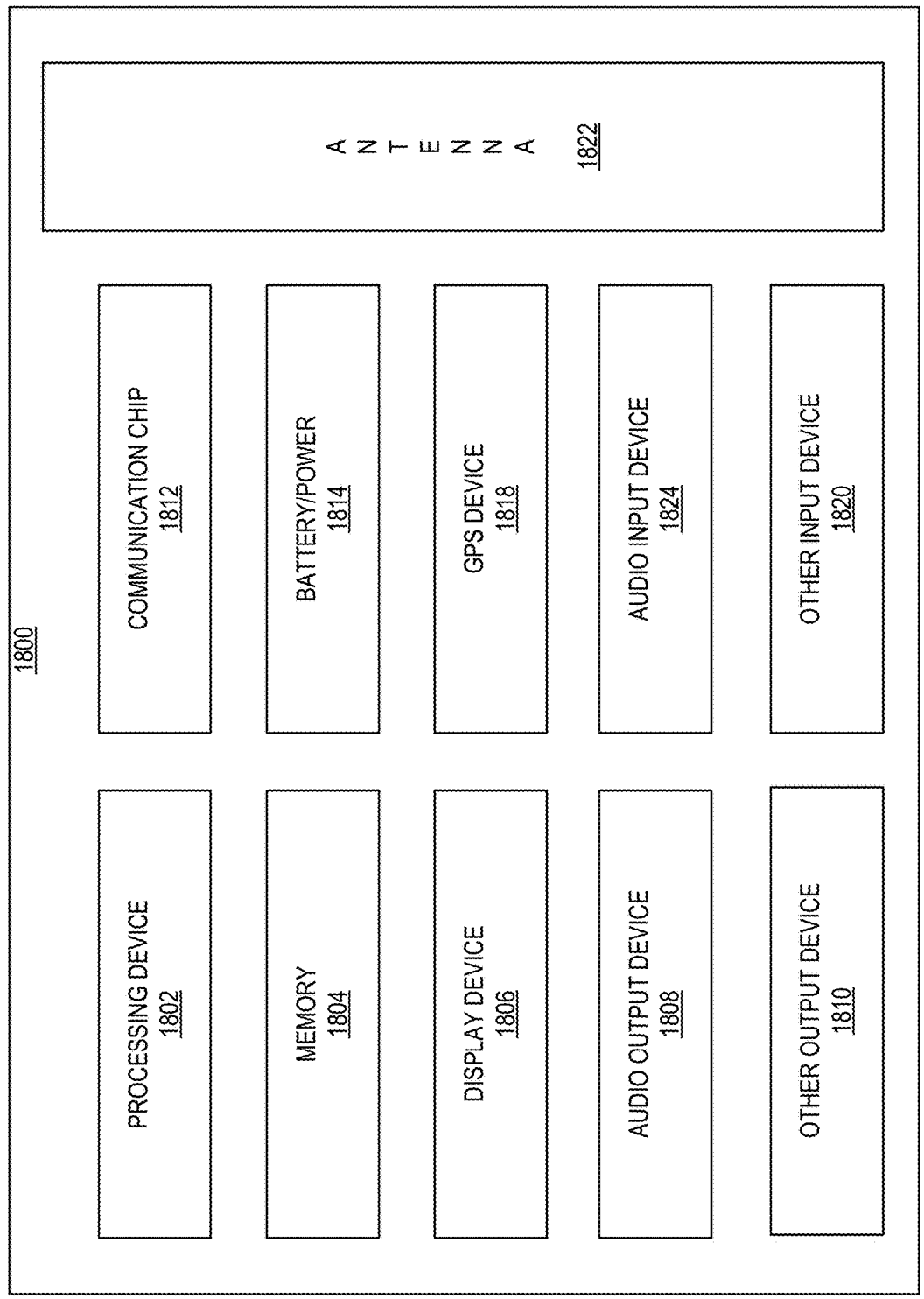
FIG. 10 is a block diagram of an example electrical device that may include a multi-filter AWR die, in accordance with various embodiments.

FIG. 10 is a block diagram of an example electrical device 1800 that may include one or more multi-filter AWR dies, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes an AWR die comprising: a die body; a first filter in the die body, wherein the first filter has or is related to a first bandwidth; and a second filter in the die body, wherein the second filter has or is related to a second bandwidth.

Example 1.5 include the AWR die of example 1, wherein the first bandwidth is different than the second bandwidth.

Example 2 includes the AWR die of example 1, wherein the first filter includes a piezo layer positioned in the die body.

Example 3 includes the AWR die of example 2, wherein the first filter includes a first cavity and a second cavity at either side of the piezo layer.

Example 4 includes the AWR die of any of examples 1-3, wherein the die body includes one or more vias that surround a portion of the die body directly adjacent to the first filter.

Example 5 includes the AWR die of example 4, further comprising a lid coupled with the die body, wherein the lid is communicatively coupled with the one or more vias.

Example 6 includes the AWR die of example 5, wherein the lid has a lateral size that is less than a lateral size of the die body.

Example 7 includes the AWR die of example 4, wherein the die body further includes an electromagnetic interference (EMI) shielding layer that is communicatively coupled with the one or more vias.

Example 8 includes an AWR die that includes: a die body; a first filter in the die body, wherein the first filter has or is related to a first frequency bandwidth; a second filter in the die body, wherein the second filter has or is related to a second frequency bandwidth that is different than the first frequency bandwidth; a first electromagnetic interference (EMI) structure that surrounds the first filter; and a second EMI structure that surrounds the second filter.

Example 9 includes the AWR die of example 8, wherein the first filter and the second filter are piezo-based filters.

Example 10 includes the AWR die of examples 8 or 9, wherein the first EMI protection structure includes a lid coupled with a face of the die body.

Example 11 includes the AWR die of example 10, wherein the lid includes a plurality of interconnect layers.

Example 12 includes the AWR die of example 10, wherein the first EMI protection structure includes a via in the lid.

Example 13 includes the AWR die of example 12, wherein the lid includes a metallization layer that is coupled with the via.

Example 14 includes the AWR die of examples 8 or 9, wherein the first EMI protection structure includes a metallization layer of the die.

Example 15 includes the AWR die of example 14, wherein the metallization layer is a backside metallization (BSM) layer.

Example 16 includes a microelectronic package comprising: a package substrate with a first side and a second side opposite the first side; an AWR die coupled with the first side of the package substrate, wherein the AWR die includes a first filter and a second filter; and an active die coupled with the second side of the package substrate.

Example 17 includes the microelectronic package of example 16, wherein the package substrate includes a matching network between the active die and the AWR die.

Example 18 includes the microelectronic package of example 17, wherein the matching network is in an electromagnetic interference (EMI)-shielded cavity of the package substrate.

Example 19 includes the microelectronic package of example 18, wherein the EMI-shielded cavity extends into the AWR die, and wherein the EMI-shielded cavity includes the first filter positioned within the cavity.

Example 20 includes the microelectronic package of any of examples 16-19, wherein the first filter has or is related to a first bandwidth and the second filter has or is related to a second bandwidth that is different than the first bandwidth.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. An acoustic wave resonator (AWR) die comprising:
a die body comprising a first layer and a second layer neighboring the first layer;
a first filter in the die body, wherein the first filter has a first bandwidth; and
a second filter in the die body, wherein the second filter has a second bandwidth that is different than the first bandwidth,
wherein at least one of the first and second filters comprises a piezoelectric layer positioned at an interface of the first layer and the second layer, a portion of the piezoelectric layer is in the first layer, another portion of the piezoelectric layer is in the second layer, and the piezoelectric layer is suspended in a cavity formed in the first layer and the second layer.

2. The AWR die of claim 1, wherein the die body includes one or more vias that surround a portion of the die body directly adjacent to the first filter.

3. The AWR die of claim 2, further comprising a lid coupled with the die body, wherein the lid is communicatively coupled with the one or more vias.

4. The AWR die of claim 3, wherein the lid has a lateral size that is less than a lateral size of the die body.

5. The AWR die of claim 2, wherein the die body further includes an electromagnetic interference (EMI) shielding layer that is communicatively coupled with the one or more vias.

6. The AWR die of claim 1, wherein the cavity is surrounded by one or more shielding elements formed in the first layer.

7. The AWR die of claim 6, wherein the one or more shielding elements comprise one or more shielding vias, one or more shielding pads, one or more shielding traces, or some combination thereof.

8. The AWR die of claim 7, wherein the one or more shielding element comprise two shielding vias and a shielding trace that connects the two shielding vias to each other.

9. An acoustic wave resonator (AWR) die that includes:
a die body comprising a first layer and a second layer neighboring the first layer;
a first filter in the die body, wherein the first filter is related to a first frequency bandwidth;
a second filter in the die body, wherein the second filter is related to a second frequency bandwidth that is different than the first frequency bandwidth, wherein at least one of the first and second filters comprises a piezoelectric layer positioned at an interface of the first layer and the second layer, a portion of the piezoelectric layer is in the first layer, another portion of the piezoelectric layer is in the second layer, and the piezoelectric layer is suspended in a cavity formed in the first layer and the second layer;
a first electromagnetic interference (EMI) structure that surrounds the first filter; and
a second EMI structure that surrounds the second filter.

10. The AWR die of claim 9, wherein the first EMI structure includes a lid coupled with a face of the die body.

11. The AWR die of claim 10, wherein the first EMI structure includes a via in the lid.

12. The AWR die of claim 11, wherein the lid includes a metallization layer that is coupled with the via.

13. The AWR die of claim 10, wherein the lid includes a plurality of interconnect layers.

14. The AWR die of claim 9, wherein the first EMI structure includes a metallization layer of the die.

15. The AWR die of claim 14, wherein the metallization layer is a backside metallization (BSM) layer.

16. A microelectronic package comprising:
a package substrate with a first side and a second side opposite the first side;
an acoustic wave resonator (AWR) die coupled with the first side of the package substrate, wherein the AWR die includes a first filter and a second filter, wherein at least one of the first and second filters comprises a piezoelectric layer positioned at an interface of a first layer and a second layer, a portion of the piezoelectric layer is in the first layer, another portion of the piezoelectric layer is in the second layer, and the piezoelectric layer is suspended in a cavity formed in the first layer and the second layer; and
an active die coupled with the second side of the package substrate.

17. The microelectronic package of claim 16, wherein the package substrate includes a matching network between the active die and the AWR die.

18. The microelectronic package of claim 17, wherein the matching network is in an electromagnetic interference (EMI)-shielded cavity of the package substrate.

19. The microelectronic package of claim 18, wherein the EMI-shielded cavity extends into the AWR die, and wherein the EMI-shielded cavity includes the first filter positioned within the cavity.

20. The microelectronic package of claim 16, wherein the first filter is related to a first bandwidth and the second filter is related to a second bandwidth that is different than the first bandwidth.

* * * * *